US006534844B1

United States Patent
Dove et al.

(10) Patent No.: US 6,534,844 B1
(45) Date of Patent: Mar. 18, 2003

(54) INTEGRATED DECOUPLING NETWORKS FABRICATED ON A SUBSTRATE HAVING SHIELDED QUASI-COAXIAL CONDUCTORS

(75) Inventors: Lewis R Dove, Monument, CO (US); John F Casey, Colorado Springs, CO (US); Anthony R Blume, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/021,380

(22) Filed: Oct. 30, 2001

(51) Int. Cl.[7] .............................................. H01L 29/00
(52) U.S. Cl. ...................... 257/532; 257/265; 257/692; 257/734
(58) Field of Search ................................ 257/692, 723, 257/724, 700, 734, 737, 686, 698, 93, 704, 265, 532

(56) References Cited

U.S. PATENT DOCUMENTS

| 3,852,670 | A | * | 12/1974 | Ma | 334/15 |
| 4,775,573 | A | * | 10/1988 | Turek | 174/254 |
| 5,639,989 | A | * | 6/1997 | Higgins, III | |
| 5,953,213 | A | * | 9/1999 | Napierala | 174/52.1 |
| 5,982,635 | A | * | 11/1999 | Menzies et al. | 361/790 |
| 6,255,730 | B1 | * | 7/2001 | Dove et al. | 257/664 |

* cited by examiner

Primary Examiner—David Nelms
Assistant Examiner—Long Tran
(74) Attorney, Agent, or Firm—Edward L. Miller

(57) ABSTRACT

A hybrid circuit having a quasi-coaxial fully shielded conductor, and incorporating a ground plane on the component side of a substrate, can bypass and/or filter a signal using integrated thick film components and without through holes or vias. A thin pad of suitable dielectric material may be printed onto the ground plane and then have a layer of metal deposited on its top surface, forming a bypass capacitor. The bypass capacitor can be located very near where it is needed, and only a very short conductor is required to connect the metallic top of the bypass capacitor to the location to be bypassed. The short connecting conductor does not go from one side of the substrate to the other, and the thickness and low dielectric constant of the substrate do not compromise the value of the bypass capacitor. Thick film resistors can be included to form filters, and surface mount resistors and capacitors can be used also.

3 Claims, 2 Drawing Sheets

US 6,534,844 B1

INTEGRATED DECOUPLING NETWORKS FABRICATED ON A SUBSTRATE HAVING SHIELDED QUASI-COAXIAL CONDUCTORS

REFERENCE TO RELATED PATENTS

U.S. Pat. No. 6,255,730 B1 (to Dove, Casey and Blume, issued Jul. 3, 2001) describes various thick film techniques that become possible with the recent advent of certain dielectric materials. These are KQ-120 and KQ-CL907406, which are products of Heraeus Cermalloy, 24 Union Hill Road, West Conshohocken, Pa. Hereinafter, we shall refer to these products as the "KQ dielectric," or as simply "KQ." In particular, that Patent describes the construction of an "encapsulated" microstrip transmission line. This Disclosure concerns further novel and useful thick film techniques associated with the use of an encapsulated microstrip transmission line, and not heretofore practical, that may be practiced in the thick film arts. Accordingly, U.S. Pat. No. 6,255,730 B1 is hereby incorporated herein by reference.

BACKGROUND OF THE INVENTION

A "hybrid" circuit consisting of a substrate with various thick film structures thereon that are interconnected with a plurality of ICs continues to be an attractive technique for creating functionally complex high frequency assemblies from "component" ICs. It is often the case that it is necessary or very desirable to use transmission lines to interconnect these ICs, or in connecting them to an external environment. We are particularly interested in the case when the transmission line is of the encapsulated microstrip type described in the incorporated Patent. By the term "encapsulated" that Patent means that the transmission line, which in their example is what would otherwise be called a microstrip, is fully shielded, with a ground completely surrounding the center conductor. It is not exactly what we would ordinarily term a "coaxial" transmission line, since its cross section does not exhibit symmetry about an axis. Nevertheless, we shall find it appropriate and convenient to call it (the 'encapsulated' transmission line of the '730 B1 Patent) a 'quasi-coaxial' transmission line, which, it should be noted, is pretty small (perhaps 0.050" wide by 0.010" or 0.015" high). For our present purposes, the most noteworthy thing about the quasi-coaxial transmission line is that it is fabricated on what we may call the component side of the substrate, and that the substrate itself is not used as the dielectric medium for that quasi-coaxial transmission line.

Furthermore, while we bear no ill will toward transmission lines, quasi-coaxial or otherwise, our present purpose is more in keeping with the use of what one would ordinarily call a "shielded cable." In many instances, of course, what distinguishes the two cases is not the cable (they might be identical), but the intended purpose. A power supply voltage or a bias voltage does not need to be delivered via a transmission line, but may well need to be delivered by a shielded conductor, or cable. And, an output microwave carrier should not be conveyed by just any old shielded audio cable, but by a suitable transmission line. Our point is that the suitable transmission line might do both, and that even a suitably shielded coaxial conductor structure might be mistaken for a transmission line (and it would not matter, so long as it was indeed "suitable"). Hence, we shall talk less about quasi-coaxial transmission lines than about quasi-coaxial conductors, which might serve either the purpose of a transmission line or the purpose of a shielded connection.

So now we have hybrids with quasi-coaxial conductors to interconnect things. It is true that past hybrids have had ICs and various interconnecting transmission lines to interconnect them. But prior art strip lines and microstrips have heretofore been fabricated using the substrate itself as the dielectric material. A consequence of this is that all the things that one might like to connect to the ground plane are on one side of the substrate, while the ground plane is on the other. For some purposes this is not a problem; through holes can be arranged. But it is inconsistent with other purposes, such as using a portion of the ground plane as one plate in a substantial capacitance. The dielectric constant of the substrate is too low, and it is too thick, to allow fabrication of, say, decent integrated decoupling capacitors that use the substrate as the intervening dielectric.

Unfortunately, just because ICs are small does not mean that they do not draw lots of current. They can, and often do. Unless it is prevented, such effects as instability and oscillation can result, as well as the noise induced by transients. This means that the power supplies and associated bias and other control voltages need to be bypassed, or sometimes filtered. In prior art situations where the ground plane was on the back side of the substrate that meant that a through hole was needed to allow a connection between the bypassing capacitor (which is almost certainly a piece part component) and the signal line being bypassed. This has a definite expense and is bothersome from a production viewpoint, and introduces (an undesirable) extra inductance in series with the bypass. It would be desirable if there were a less expensive, more convenient and more effective way to perform the necessary bypassing. What to do?.

SUMMARY OF THE INVENTION

A hybrid circuit having a quasi-coaxial transmission line, or fully shielded conductor, and incorporating a ground plane on the component side of a substrate can bypass and/or filter a power supply voltage or control signal using integrated thick film components and without through holes or vias. A thin pad of suitable dielectric material may be printed onto the ground plane and then have a layer of metal deposited on its top surface, forming a bypass capacitor. The bypass capacitor can be located very near where it is needed, and only a very short conductor is required to connect the metallic top of the bypass capacitor to the location to be bypassed. Since the ground plane is on the component side of the substrate, the short connecting conductor does not go from one side of the substrate to the other, and the thickness and low dielectric constant of the substrate do not compromise the value of the bypass capacitor. Thick film resistors can be included to form filters, and surface mount resistors and capacitors can be used as well, again because the ground plane is on the component side of the substrate. The conductor carrying the signal to be bypassed or filtered to the location where it is needed can be a quasi-coaxial transmission line, even if the signal it carries is not an RF signal needing a controlled impedance path, and is instead merely used as a fully shielded conductor to reduce the effects of stray coupling.

DESCRIPTION OF A PREFERRED EMBODIMENT

Figure 1:
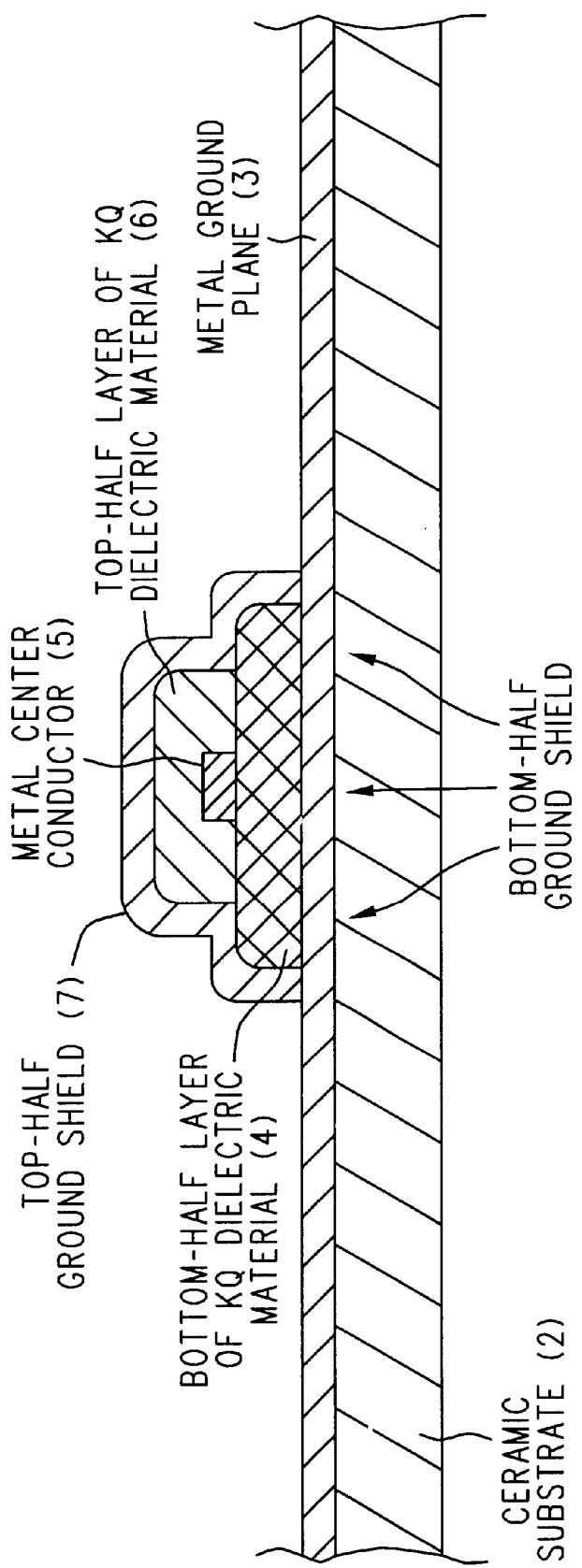
FIG. 1 is a cross sectional view of a prior art fully shielded conductor or quasi-coaxial transmission line that may carry a power supply voltage or control signal to a circuit on a hybrid and that is in need of decoupling at the point of connection.

Refer now to FIG. 1, wherein is shown a simplified representation 1 of a prior art quasi-coaxial conductor fabricated upon a substrate 2, which could, for example be 96% alumina 0.040" thick. The quasi-coaxial conductor is generally fabricated according to the thick film techniques taught in the incorporated '730 B1 Patent. In particular, note the ground plane 3, deposited on the "top" of the substrate 2 (i.e., on the same side as the quasi-coaxial conductor), and which, as ground planes do, may extend liberally in all directions as needed. The ground plane may be of metal, preferably gold, and if patterns therein are needed, an etchable thick film Au process, such as the Heraeus KQ-500 may be used. The quasi-coaxial conductor itself includes a bottom-half layer or strip 4 of KQ dielectric material, that meanders as needed for the desired path of the transmission line. (By "meanders" we do not necessarily mean that a serpentine path is taken—only that it goes where it needs to.) Once that bottom-half layer 4 is in place, a suitable layer or strip of metal 5 (which is preferably Au) is deposited on the top surface of the bottom-half layer 4. This strip of metal 5 is the center conductor of the quasi-coaxial conductor. Subsequently, a top-half layer or covering strip 6 of KQ dielectric is deposited on top of the bottom-half layer 4, enclosing the center conductor 5. Finally, an enclosing top-half ground shield 7 of metal (preferably Au) is deposited over the combined KQ layers 4 and 5, with the result that the center conductor 5 is completely surrounded by ground, and thus becomes a quasi-coaxial transmission line. The characteristic impedance of that quasi-coaxial transmission line is determined in a known manner by the dielectric constant of the KQ material and the dimensions of the KQ layers 4 and 5. Thus, the quasi-coaxial transmission line 9 may be fabricated to have a particular characteristic impedance, such as 50Ω, or perhaps 75Ω, as desired. On the other hand, however, it may be the case that no particular or constant value of characteristic impedance is required or desired, and the what is being fabricated is simply shielded conductors for conveyance of power supply, bias or control voltages.

Before proceeding, however, a brief note is in order concerning the ground plane 3. As a true ground plane it will perform best if it is indeed a broad sheet of metal, and that is what the figure shows. On the other hand, the portions of such a ground plane not beneath the quasi-coaxial transmission line do not afford any particular benefit to the transmission line, insofar as it is a transmission line considered in isolation. In any event, it may be desirable to not have an entire plane of metal serving as ground for all the quasi-coaxial conductors on the substrate. In such a case only the path of the transmission line needs to have a sufficiently wide ground (bottom-half ground shield) put down before the quasi-coaxial conductor is fabricated on top thereof. It would need to be wide enough to allow good registration and subsequent electrical contact with the top-half ground shield. It will thus be appreciated that either the portion of an entire ground plane that is directly beneath the quasi-coaxial conductor, or a sufficiently wide meandering ribbon of ground metal, forms what we have called the bottom-half ground shield.

Figure 2:
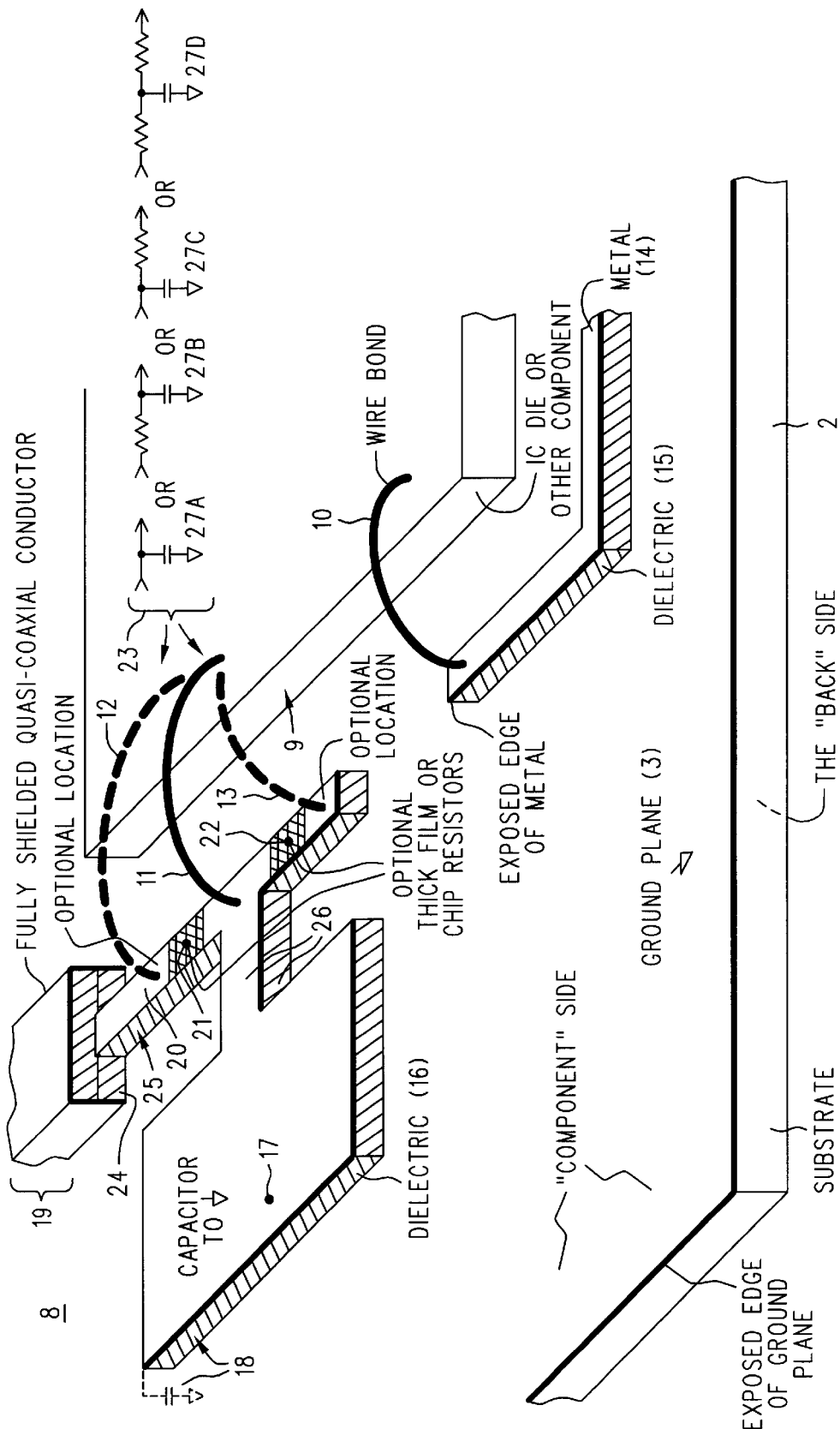
FIG. 2 is a simplified sketch of a decoupling network fabricated according to the invention.

Before proceeding to FIG. 2, a further brief word is in order concerning FIG. 1. It is principally a reworking of FIG. 2 of the incorporated '730 B1 Patent. However, a comparison would reveal the absence of the optional loading resistances 210. This is merely a simplification on our part, for clarity and ease of appreciation in the drawing. We do not mean to imply, and no one should infer, that these resistances are to be absent of necessity in any of the embodiments described herein. To the contrary, in this description we take the position that it is up to the designer to decide if they should be present or not, depending on the circumstances.

Refer now to FIG. 2, wherein is shown a simplified and stylized sketch of a decoupling structure that is possible when, according to the invention, a fully shielded quasi-coaxial conductor 19 is fabricated on the component side of a substrate 2. That is to say, when as a result of both the ground plane 3 and the fully shielded quasi-coaxial conductor 19 being on the component side. Note that there is a an IC die 9 or other component that is attached by wire bonds 10, 11, 12 and 13 (or perhaps by other connection techniques) to conductors or other components, as required by the particular circuit being implemented. So, for example, we see that wire bond 10 connects to a metal trace 14 formed by thick film techniques upon a corresponding shape of dielectric material 15. We prefer to leave the ground plane as intact as possible, rather than etch away a path for the metal trace 14 such that trace 14 can be deposited directly on the substrate. That is why trace 14 is atop its corresponding dielectric material 15.

Now consider the wire bond 11, which is connected to metallic trace 20 formed atop region of dielectric 25. Let's assume that wire bond 11 and trace 20 are associated with a signal that needs either bypassing or filtering. In either case there is a capacitor to ground 18 formed by region 17 of metal deposited upon a corresponding region of dielectric material 16. The capacitor can be thus formed because the ground plane 3 is on the component side of the substrate 2. The capacitor 18 is connected to trace 20 by connecting trace 26, which understandably is preferably as short as practical, so that the capacitor 18 is as near the signal to be bypassed (or filtered) as practical.

If all that were needed was the bypass capacitor, then region 21 of trace 20 would be just continuous trace, and the trace 20 would stop before venturing into region 22. Regions 21 and 22 are optional locations in the trace 20 where a gap in the metal can be covered either by a thick film resistance or, perhaps, by a chip (surface mount) resistor. The capacitor 18 in conjunction with the optional resistances and the alternate locations 12 and 13 for wire bond 11 (there is only one instance of wire bond here, not two or three, but it might be in one of three locations), give rise to the four different bypass/filter circuit possibilities 27A–D.

We show wire bonds 11, 12 and 13 as connecting to a metal trace 20 that becomes the center conductor of a fully shielded quasi-coaxial conductor 19. This is merely exemplary, although by no means atypical. Note that the fully shielded quasi-coaxial conductor 19 might be absent; the same bypassing and filtering networks 27A–D would still obtain. In such a case we would expect to find a fully shielded quasi-coaxial conductor somewhere else on the component side of the substrate 2. Frankly, however, and especially for microwave hybrid circuits, we would expect the usual case to be that if it need to be filtered or bypassed, then it probably needs to be shielded, lest it be a culprit toward another signal or become a victim of some culprit signal.

On the other hand, the shielding of a conductor does not necessarily mean that there is a genuine transmission line involved. That is why we have talked in terms of fully shielded quasi-coaxial conductors. If controlled characteristic impedance is not an issue, then the impetus for using the KQ dielectric materials diminishes, as that is directed toward obtaining low losses and practical dimensions for quasi-coaxial transmission lines of usable $Z_0$. Under the more relaxed requirements for having simply a fully shielded quasi-coaxial conductor, other dielectric materials may be desirable, as well. This particularly so for the dielectric material 16 under metallic region 17, and that forms the dielectric for capacitor 18. A dielectric material different than KQ can produce a significantly higher value of capacitance for capacitor 18. By the same token, to minimize capacitive coupling between a trace and ground (say for trace 14) then it might be built atop a dielectric material that has a low dielectric constant.

We claim:

1. A thick film circuit assembly comprising:

a substrate having component side and a non-component side, the component side being an outside surface of the substrate that carries components mounted directly thereon;

a ground plane directly upon the component side;

a component mounted directly on the component side and having a signal terminal;

a metallic trace formed atop a corresponding trace region of dielectric material itself formed atop the ground plane, and approaching the signal terminal;

a capacitor formed of metal deposited atop a corresponding region of capacitor dielectric material proximate where the metallic trace approaches the signal terminal, the capacitor dielectric material itself formed directly atop the ground plane and the metal of the capacitor being coextensive with, and electrically connected to, the metallic trace; and an electrical connection from the metallic trace and the signal terminal of the component.

2. A thick film circuit assembly as in claim 1 further comprising a fully shielded quasi-coaxial conductor on the component side.

3. A thick film circuit assembly as in claim 1 wherein the metallic trace includes a resistor in series with one of the capacitor and the electrical connection.

* * * * *